(12) United States Patent
Chen (10) Patent No.: US 10,670,231 B2
(45) Date of Patent: Jun. 2, 2020

(54) LIGHT CONVERSION MATERIAL WITH LIGHT REFLECTIVE STRUCTURE AND LIGHT-EMITTING DIODE DEVICE HAVING THE SAME

(71) Applicant: National Tsing Hua University, Hsinchu (TW)

(72) Inventor: Hsueh-Shih Chen, Hsinchu (TW)

(73) Assignee: National Tsing Hua University (TW)

( * ) Notice: Subject to any disclaimer, the term of this patent is extended or adjusted under 35 U.S.C. 154(b) by 7 days.

(21) Appl. No.: 15/993,595

(22) Filed: May 31, 2018

(65) Prior Publication Data

US 2019/0301709 A1 Oct. 3, 2019

(30) Foreign Application Priority Data

Apr. 3, 2018 (TW) .............................. 107111832 A (51) Int. Cl.
| | |
|---|---|
| *F21V 9/38* | (2018.01) |
| *H01L 33/48* | (2010.01) |
| *H01L 33/50* | (2010.01) |
| *H01L 33/64* | (2010.01) |
| *H01L 33/58* | (2010.01) |
| *H01L 33/60* | (2010.01) |
| *H01L 33/62* | (2010.01) |

(52) U.S. Cl.
CPC .............. *F21V 9/38* (2018.02); *H01L 33/486* (2013.01); *H01L 33/504* (2013.01); *H01L 33/507* (2013.01); *H01L 33/58* (2013.01); *H01L 33/60* (2013.01); *H01L 33/62* (2013.01); *H01L 33/642* (2013.01)

(58) Field of Classification Search
CPC ..... F21V 9/30; F21V 9/35; F21V 9/38; H01L 33/504; H01L 33/507; H01L 33/60
See application file for complete search history.

(56) References Cited

U.S. PATENT DOCUMENTS

2016/0258583 A1* 9/2016 Shi .................... C23C 16/45525

\* cited by examiner

*Primary Examiner* — Tucker J Wright (57) ABSTRACT

The present invention discloses a light conversion material with light reflective structure, comprises: a transparent substrate, a plurality of first light conversion films and second light conversion films. Particularly, the second light conversion film is disposed between two of the first light conversion films, and has a refractive index greater than that of the first light conversion film. By such design, when a short-wavelength light is incident on the first light conversion films and the second light conversion films, parts of the short-wavelength light have a reflected light forming at the junction between the two light conversion films, and the reflected light would bounce back to the first light conversion film and/or the second light conversion film, thereby those unconverted short-wavelength light being prevented from directly passing the light conversion material. Briefly speaking, this light conversion material exhibits an outstanding performance on short-wavelength light recycling.

10 Claims, 12 Drawing Sheets

FIG. 13B

LIGHT CONVERSION MATERIAL WITH LIGHT REFLECTIVE STRUCTURE AND LIGHT-EMITTING DIODE DEVICE HAVING THE SAME

BACKGROUND OF THE INVENTION

1. Field of the Invention

The present invention relates to the technology field of light conversion films, and more particularly to a light conversion material with light reflective structure and a light-emitting diode device having the same light conversion material.

2. Description of the Prior Art

Light-emitting diodes (LEDs) have been widely applied in various luminous devices used in human life because of having advantages of small size and long service life. Moreover, it is well known that phosphor powder is a traditional light conversion material used in the LED. However, with the advancement in development and manufacture technologies of quantum dots (QDs), it is received much attention that the QDs are adopted for being as the principle light conversion material in the LED instead of the traditionally-used phosphor powder.

Figure 1:
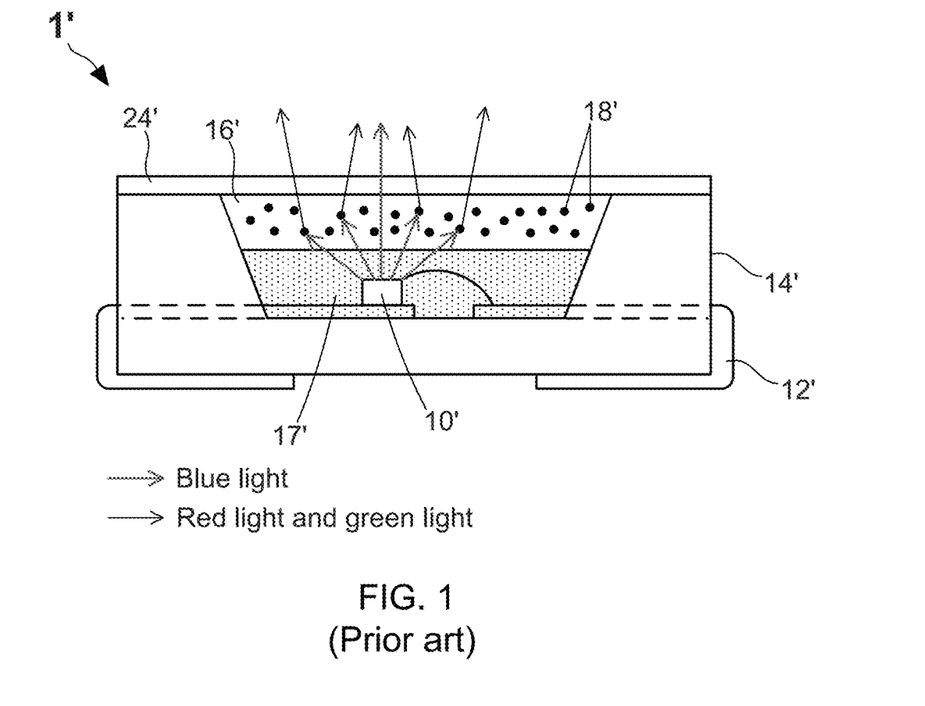
FIG. 1 shows a cross-sectional side view of one QD-LED disclosed by U.S. publication No. 2017/096538 A1.

FIG. 1 shows a cross-sectional side view of a conventional QD-LED disclosed by U.S. publication No. 2017/096538 A1. From FIG. 1, it is clear that conventional QD-LED 1' mainly comprises: an insulation body 14', a lead frame 12', an LED chip 10', an encapsulation member 17', and a light conversion member consisting of a encapsulation layer 16' and a plurality of QDs 18' dispersed in the encapsulation layer 16'. It is worth noting that, a barrier layer 24' is further disposed on the encapsulation layer 16' for providing a moisture blocking function. In the conventional QD-LED 1', the size of the QDs 18' is controlled to be in a range between 5 nm and 20 nm as well as 2 nm and 10 nm, such that the QDs 18' are able to simultaneously radiate red light and green light after being excited by a short-wavelength light emitted from the LED chip 10', such as blue light or purple-blue light.

Figure 2:
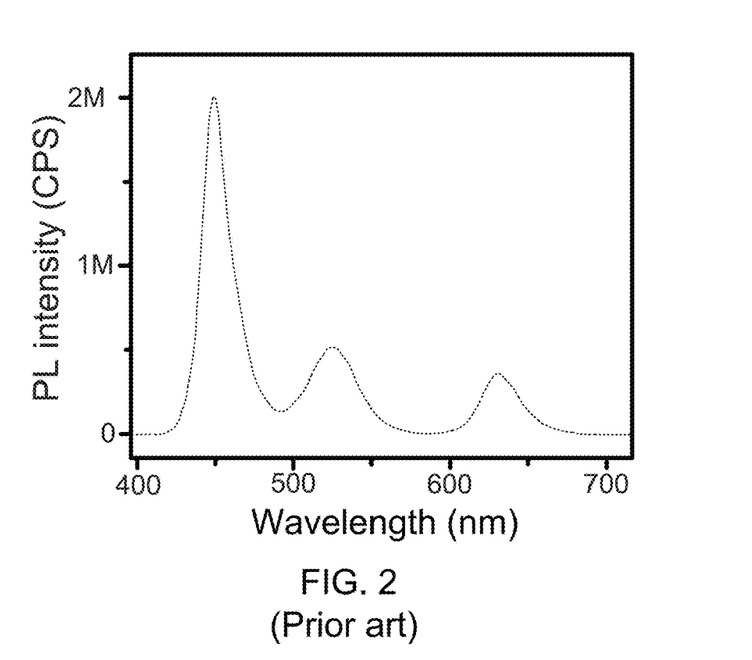
FIG. 2 shows a photoluminescence (PL) spectrum of the light conversion layer.
Figure 3:
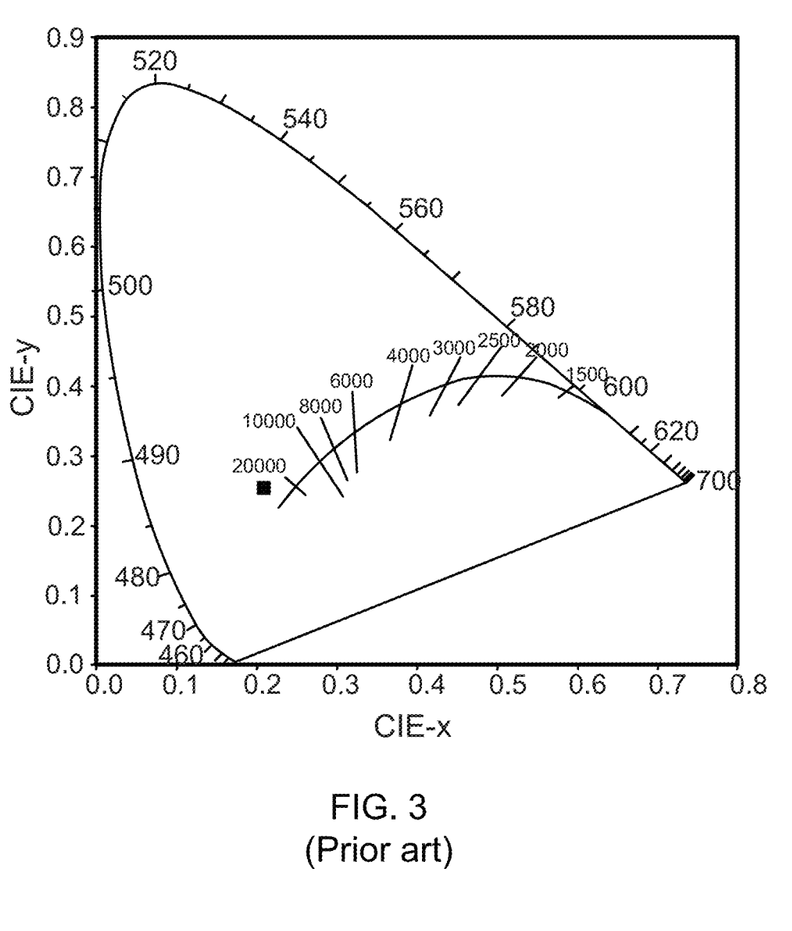
FIG. 3 shows a CIE 1931 chromaticity diagram.

It is a pity that, only a few of the short-wavelength light would be converted to the red light and the green light, but the most of the short-wavelength light directly pass through the light conversion layer. Please refer to FIG. 2 and FIG. 3, wherein FIG. 2 shows a photoluminescence (PL) spectrum of the light conversion layer, and FIG. 3 presents a CIE 1931 chromaticity diagram. From FIG. 2, it is found that the purple-blue light irradiated from the light conversion layer exhibits a light intensity greater than other two PL beams (i.e., the red light and the green light), thereby causing the QD-LED 1' performs an unideal illumination uniformity. Moreover, owing to the fact that the PL intensity of the blue light is much larger than that of other two PL beams, white light emitted by the QD-LED 1' has a color temperature (CT) exceeding 10,000K.

From above descriptions, it is clear that how to design and manufacture a new light conversion layer capable of reducing the PL intensity of the blue light and simultaneously enhancing the PL intensity of the red light and the green light by effectively recycling those unconverted blue light has become an important issue. In view of that, inventors of the present application have made great efforts to make inventive research and eventually provided a light conversion material with light reflective structure and a light-emitting diode device having the same light conversion material.

SUMMARY OF THE INVENTION

The primary objective of the present invention is to disclose a light conversion material with light reflective structure and a light-emitting diode (LED) device having the light conversion material. The light conversion material is applied in the LED device and comprises: a transparent substrate, a plurality of first light conversion films and a plurality of second light conversion films. Particularly, each one of the plurality of second light conversion films is disposed between two of the plurality of first light conversion films, and the refractive index of the second light conversion film is greater than that of the first light conversion film. By such design, when a short-wavelength light passes through the transparent substrate and is subsequently incident on the first light conversion films and the second light conversion films, parts of the short-wavelength light not be converted to red light and/or green light have a reflected light forming at the junction between the first light conversion film and the second light conversion film, and the reflected light would be bounced back to the first light conversion films and/or the second light conversion films. By such way, those unconverted the short-wavelength light are effectively prevented from directly passing the light conversion material. Briefly speaking, this light conversion material exhibits an outstanding performance on short-wavelength light recycling, thereby the LED integrated with the light conversion material being able to emit a white light with enhanced illumination uniformity and color rendering.

In order to achieve the primary objective of the present invention, the inventor of the present invention provides an embodiment for the light conversion material with light reflective structure, comprising:

a transparent substrate;

at least four first light conversion films, formed on the top surface of the transparent substrate, wherein each of the plurality of first light conversion films comprises a first encapsulation layer and a plurality of first light conversion particles dispersed in the first encapsulation layer; and at least four second light conversion films, wherein each one of the plurality of second light conversion films is disposed between two of the plurality of first light conversion films, and each of the plurality of second light conversion films comprising a second encapsulation layer and a plurality of second light conversion particles dispersed in the second encapsulation layer;

wherein the first encapsulation layer has a first refractive index and the second encapsulation layer has a second refractive index greater than the first refractive index;

wherein when a short-wavelength light passes through the transparent substrate via the bottom surface of the transparent substrate and is subsequently incident on the first light conversion films and the second light conversion films, parts of the short-wavelength light being converted to a red light and/or a green light by the first light conversion films and the second light conversion films;

wherein parts of the short-wavelength light not to be converted to the green light and/or the red light would have a reflected light forming at the junction between the first light conversion film and the second light conversion film, and the reflected light would bounce back into the first light conversion film and/or the second light conversion film;

wherein the other parts of the short-wavelength light directly pass through the at least four first light conversion films and the at least four second light conversion films.

Furthermore, in order to achieve the primary objective of the present invention, the inventor of the present invention also provides an embodiment for the light-emitting diode (LED) device having the light conversion material, comprising: an insulation body having a recess;
a lead frame, being disposed in the insulation body and having at least two welding portions and at least two electrode portions; wherein the welding portions are located in the recess, and the electrode portions being extending out of the insulation body;
at least one LED die, being disposed in the LED accommodating recess and connected to the welding portions, used for emitting a short-wavelength light;
a colloidal encapsulation, being filled into the recess for enclosing the LED die and the welding portions; and
a light conversion material with light reflective structure, being disposed on the colloidal encapsulation, and comprising:
a transparent substrate;
at least four first light conversion films, being formed on the top surface of the transparent substrate, wherein each of the plurality of first light conversion films comprises a first encapsulation layer and a plurality of first light conversion particles dispersed in the first encapsulation layer; and
at least four second light conversion films, wherein each one of the plurality of second light conversion films is disposed between two of the plurality of first light conversion films, and each of the plurality of second light conversion films comprising a second encapsulation layer and a plurality of second light conversion particles dispersed in the second encapsulation layer;
wherein the first encapsulation layer has a first refractive index and the second encapsulation layer has a second refractive index greater than the first refractive index;
wherein when a short-wavelength light passes through the transparent substrate via the bottom surface of the transparent substrate and is subsequently incident on the first light conversion film and the second light conversion film, parts of the short-wavelength light being converted to a red light and/or a green light by the first light conversion film and the second light conversion film;
wherein parts of the short-wavelength light not to be converted to the green light and/or the red light would have a reflected light forming at the junction between the first light conversion film and the second light conversion film, and the reflected light would bounce back into the first light conversion film and/or the second light conversion film;
wherein the other parts of the short-wavelength light directly pass through the at least four first light conversion films and the at least four second light conversion films.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a light conversion material with light reflective structure and a light-emitting diode device having the light conversion material disclosed by the present invention, embodiments of the present invention will be described in detail with reference to the attached drawings hereinafter.

First Embodiment

Figure 4:
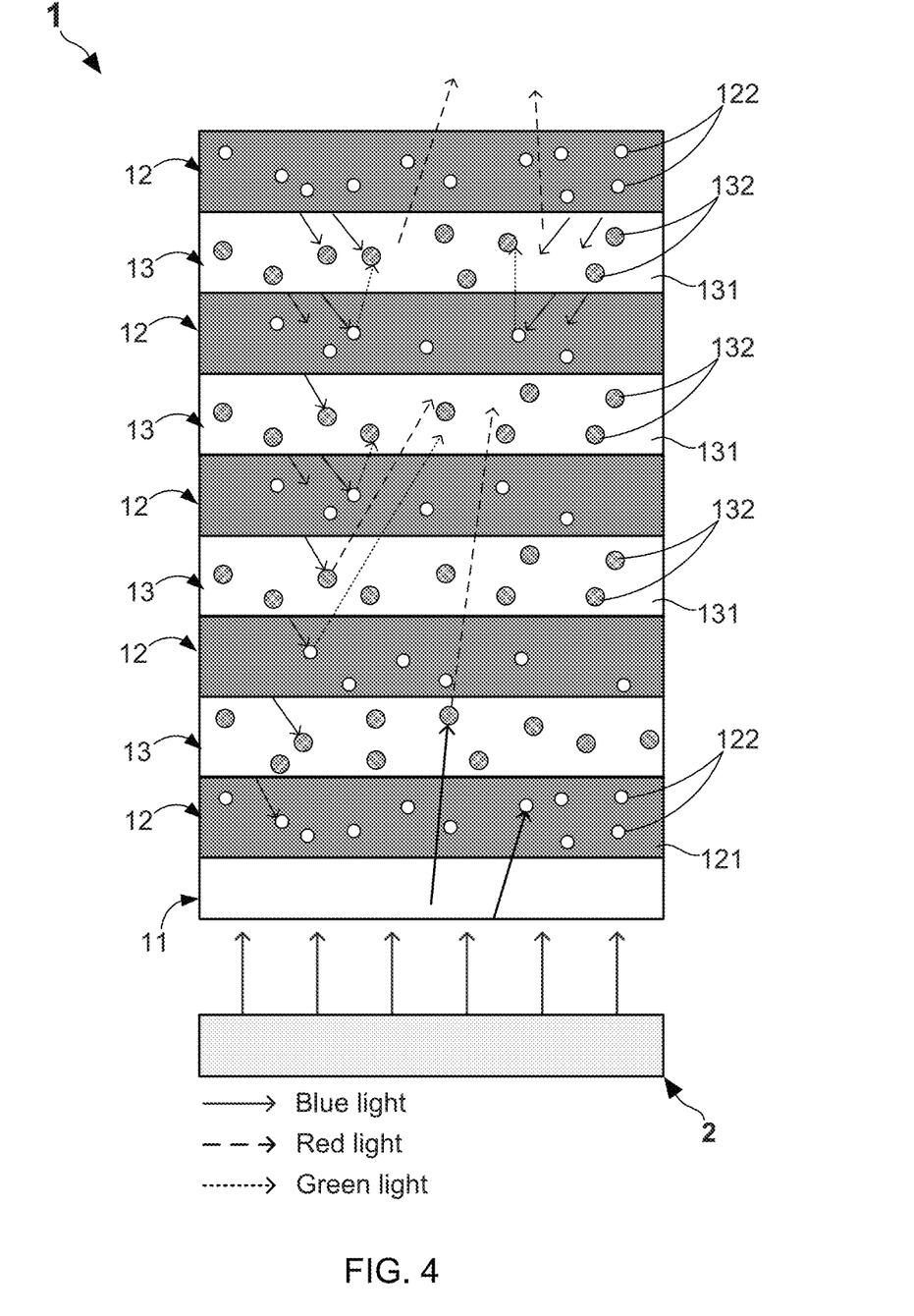
FIG. 4 shows a cross-sectional side view of a first embodiment of a light conversion material with light reflective structure according to the present invention.

With reference to FIG. 4, there is provided a cross-sectional side view of a first embodiment of a light conversion material with light reflective structure according to the present invention. From FIG. 4, it is understood that the light conversion material 1 with light reflective structure mainly comprises: a transparent substrate 11, at least four first light conversion films 12 and at least four second light conversion films 13, wherein the manufacturing material of the transparent substrate 11 can be (but not limited to be) polymethylmethacrylate (PMMA), polycarbonate (PC), polyethylene terephthalate (PET), polyurethane (PU), polyimide (PI).

The first light conversion films are formed on the top surface of the transparent substrate 11, and each of the first light conversion films comprises a first encapsulation layer 121 and a plurality of first light conversion particles 122 dispersed in the first encapsulation layer 121. It is worth explaining that, each one of the second light conversion films 13 is disposed between two of the first light conversion films 12, and each of the second light conversion films 13 comprises a second encapsulation layer 131 and a plurality of second light conversion particles 132 dispersed in the second encapsulation layer 131. According to the present invention's particular design, the first encapsulation layer 121 has a first refractive index and the second encapsulation layer 131 has a second refractive index greater than the first refractive index.

By such structure design, when a lighting element 2 emits a short-wavelength light (such as blue light or purple-blue light) to pass through the transparent substrate 11 via the bottom surface of the transparent substrate 11, the short-wavelength light would be subsequently incident on the first light conversion films 12 and the second light conversion films 13, thereby parts of the short-wavelength light are converted to a red light and/or a green light by the first light conversion films and the second light conversion films. It is noted that, both the first light conversion film 12 and the second light conversion film 13 have a thickness equal to one-quarter wavelength of the short-wavelength light, such that parts of the short-wavelength light not to be converted to the green light and/or the red light would have a reflected light forming at the junction between the first light conversion film 12 and the second light conversion film 13. Moreover, because the refractive index of the second encapsulation layer 131 is higher than that of the first encapsulation layer 131, the reflected light forming at the junction would therefore be bounced back into the first light conversion films 12 and/or the second light conversion films 12. By such way, those unconverted short-wavelength light are effectively prevented from directly passing the light conversion material 1. Briefly speaking, this light conversion material 1 has an outstanding performance on short-wavelength light recycling.

As FIG. 4 shows, one of the first light conversion particles 122 and the second light conversion particles 132 converts the short-wavelength light to the green light, and the other one converting the short-wavelength light to the red light. For instance, because the second light conversion particles 132 is designed to irradiate red light after being excited by the short-wavelength light, the second light conversion particles 132 can be phosphor powder or quantum dots with size greater than 5 nm. Moreover, in contrast to the second light conversion particles 132, phosphor powder or quantum dots with size being controlled in a range of 2-10 nm are adopted for being the first light conversion particles 122, in order to make the first light conversion particles 122 irradiate green light after being excited by the short-wavelength light. Exemplary materials of the phosphor powder and the quantum dots for being used as the light conversion particles are integrated and listed in following Table (1) and Table (2).

TABLE (1)

| Types of fluorescent powder | Corresponding exemplary material |
|---|---|
| Aluminate phosphor | Eu doped Y—Al—O multi-composition phosphor |
| Silicate phosphor | $Ca_3Si_2O_7:Eu^{2+}$ |
| Phosphate phosphor | $KSr_{1-x}PO_4:Tb_x$ |
|  | $K_2SiF_6:Mn^{4+}$ (KSF) |
| Sulfide phosphor | ZnS:X |
|  | X = Au, Ag, Cu, Mn, Cd |
| Nitride phosphor | $\beta$-SiAlON:$Eu^{2+}$ |
| Other-type phosphor | $SrGa_2S_4:Eu^{2+}$ (SGS) |

TABLE (2)

| Types of quantum dot (QD) | Corresponding exemplary material |
|---|---|
| Group II-VI compounds | CdSe or CdS |
| Group III-V compounds | (Al, In, Ga)P, (Al, In, Ga)As, or (Al, In, Ga)N |
| Group III-V compounds having core-shell structure | CdSe/ZnS core-shell QD |
| Group III-V compounds having core-shell structure | InP/ZnS core-shell QD |
| Group II-VI compounds having non-spherical alloy structure | ZnCdSeS |

It needs to emphasize that the exemplary materials listed in Table (1) and Table (2) does not used to limit the manufacturing material of the first light conversion particles 121 and the second light conversion particles 132. On the other hand, the first encapsulation layer 121 is made of a material with low refractive index, wherein the material can be (but not limited to be) tetraethyl orthosilicate (TEOS), isooctyl acrylate, $SiO_2$, polydimethylsiloxane (PDMS), $MgF_2$, or combination of any aforesaid two or more materials.

In contrast to the first encapsulation layer 121, the second encapsulation layer 131 is made of a material with high refractive index, wherein the material can be (but not limited to be) $HfO_2$, ZnO, $TiO_2$, $TeO_2$, $MoO_3$, $ZrO_2$, $TaO_2$, $Nb_2O_5$, or combination of any aforesaid two or more materials. Exemplary materials of the high-refractive index material and the low-refractive index material are listed in following Table (3) and Table (4). Herein it is prompted that, engineers skilled in development and manufacture of various optical films should know that an optical film with high refractive index can be formed by mixing or combining a transparent material (such as glass, PET, PC, PMMA) and a high-refractive index material based on a specific mixing ratio. Of course, an optical film with low refractive index can also be formed by mixing or combining the transparent material and a low-refractive index material.

TABLE (3)

| Low-refractive index material | Refractive index |
|---|---|
| PDMS | 1.38 |
| $MgF_2$ | 1.38 |
| $SiO_2$ | 1.45 |
| TEOS | 1.48 |

TABLE (4)

| High-refractive index material | Refractive index |
|---|---|
| $HfO_2$ | ~1.95 |
| ZnO | ~2.0 |
| $TiO_2$ | 2.4-2.6 |
| $Ta_2O_5$ | 2.0-2.4 |
| $Nb_2O_5$ | ~2.24 |

Second Embodiment

Figure 5:
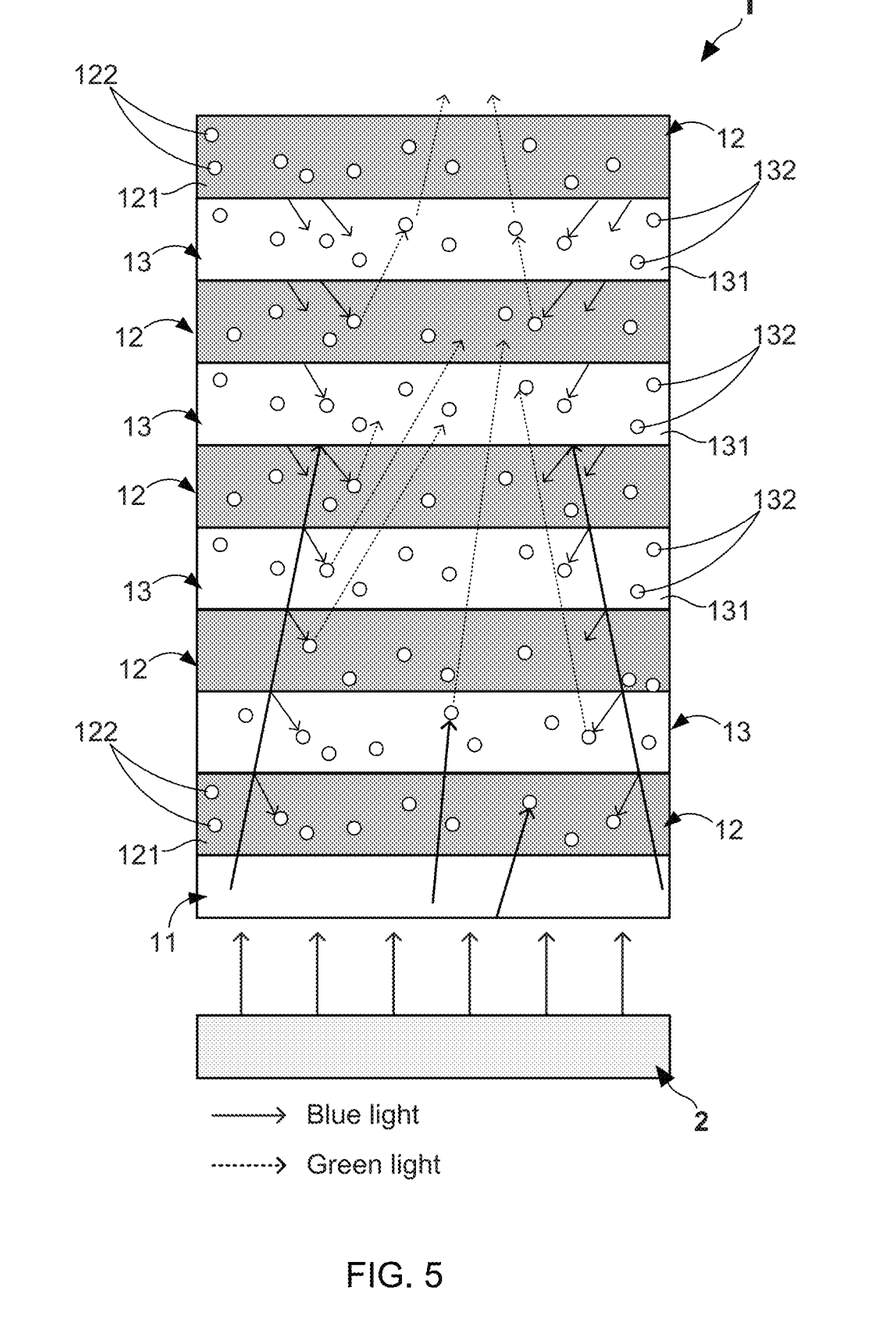
FIG. 5 shows a cross-sectional side view of a second embodiment of the light conversion material with light reflective structure.

FIG. 5 shows a cross-sectional side view of a second embodiment of the light conversion material with light reflective structure. After comparing FIG. 5 with FIG. 4, it is found that the first light conversion particles 122 and the second light conversion particles 132 are designed to convert the short-wavelength light to a monochromatic light, such as green light or red light. Of course, the first light conversion particles 122 and the second light conversion particles 132 can also be designed to convert the short-wavelength light to other different monochromatic lights. For instance, QDs are adopted for being the first light conversion particles 122 and the second light conversion particles 132, therefore relationships between the monochromatic lights and the size of the QDs are integrated in following Table (5).

TABLE (5)

| Monochromatic lights | Size of the QDs |
|---|---|
| Blue-green light | 2-7 nm |
| Green light | 3-10 nm |
| Yellow light | 4-12 nm |
| Orange light | 4-14 nm |
| Red light | 5-20 nm |

Third Embodiment

Figure 6A:
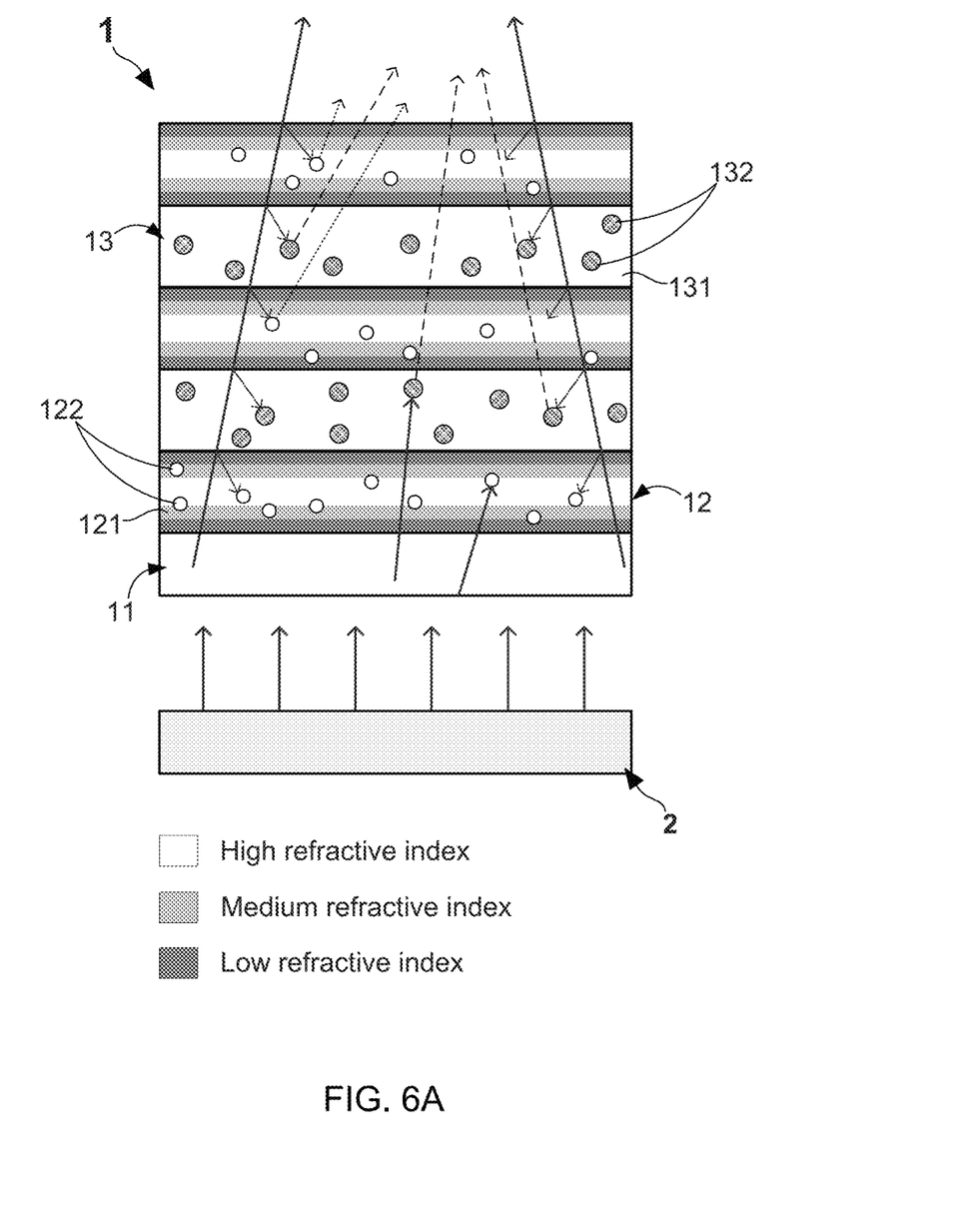
FIG. 6A and FIG. 6B show two cross-sectional side views of a third embodiment of the light conversion material with light reflective structure.
Figure 6B:
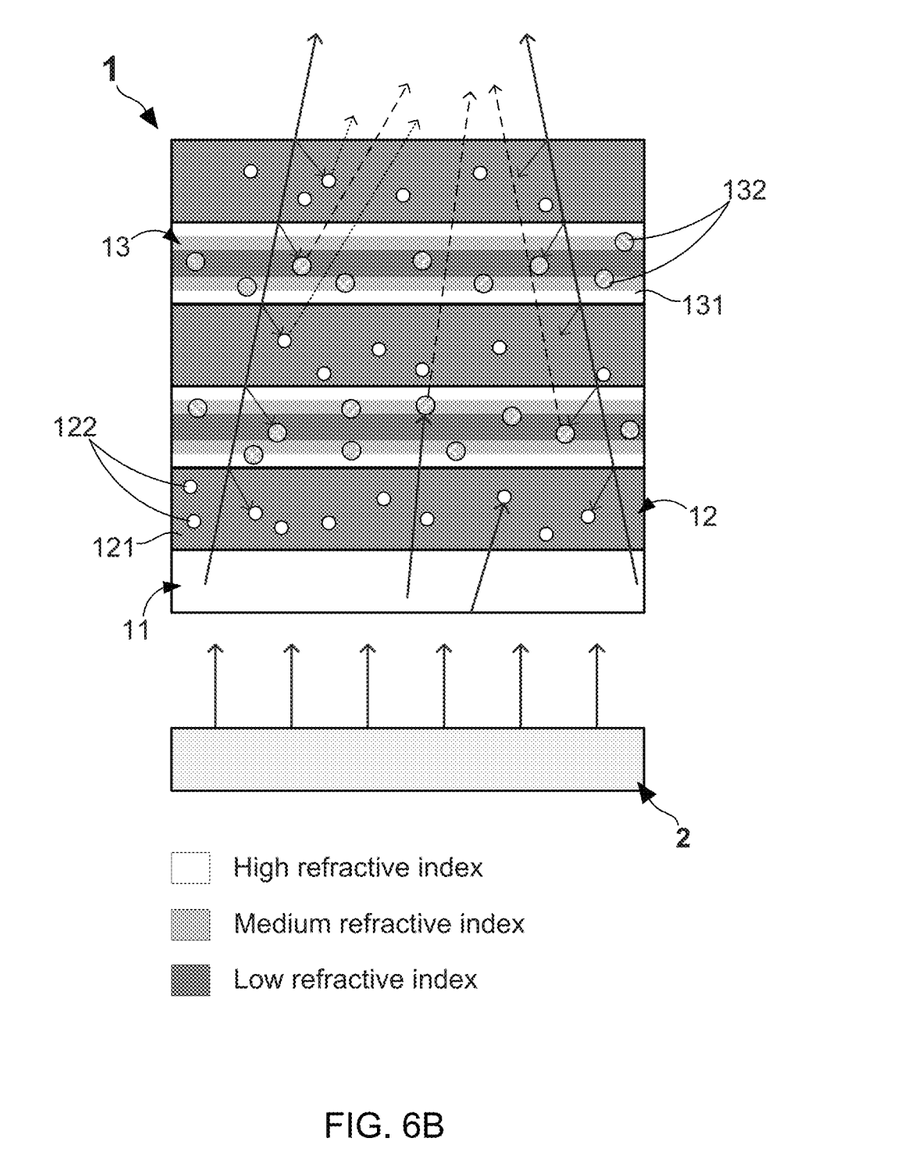

With reference to FIG. 6A and FIG. 6B, there are provided two cross-sectional side views of a second embodiment of the light conversion material with light reflective structure. In FIG. 6A, the first refractive index is gradiently increased from the junction of the first encapsulation layer 121 and the second encapsulation layer 131 to the center of the first encapsulation layer 121. On the contrary, in FIG. 6B, the second refractive index is gradiently decreased from the junction of the second encapsulation layer 131 and the first encapsulation layer 121 to the center of the second encapsulation layer 131. It needs to further explain that, the said material with medium refractive index can be (but not limited to) $Al_2O_3$, $HfO_2$, MgO, ZnO, $Y_2O_3$, and combination of any aforesaid two or more materials. Exemplary materials of the medium-refractive index material are listed in following Table (6).

TABLE (4)

| Medium-refractive index material | Refractive index |
|---|---|
| $Al_2O_3$ | ~1.65 |
| $Y_2O_3$ | ~1.8 |
| MgO | ~1.72 |

Fourth Embodiment

Figure 7:
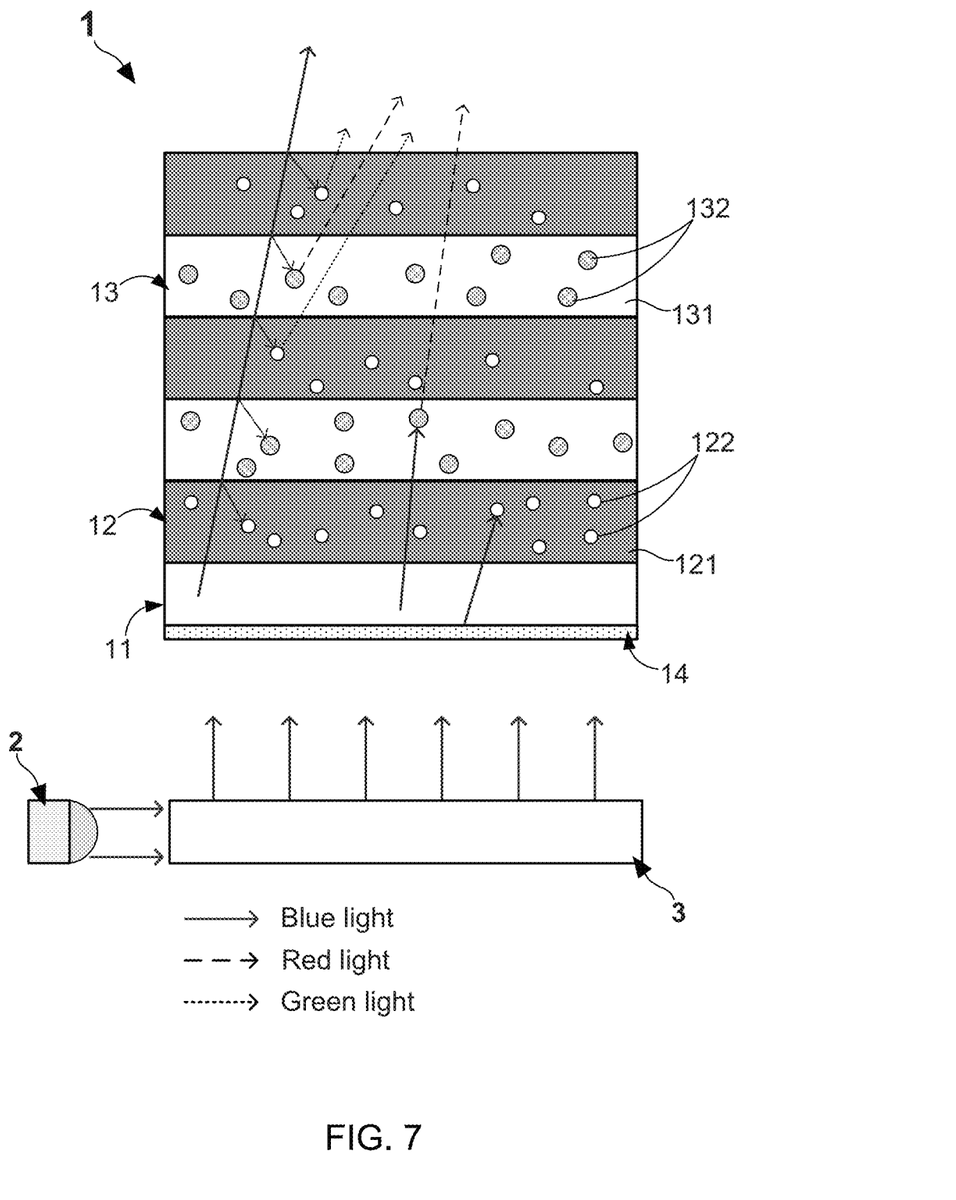
FIG. 7 shows a cross-sectional side view of a fourth embodiment of the light conversion material with light reflective structure.

FIG. 7 shows a cross-sectional side view of a fourth embodiment of the light conversion material with light reflective structure. In FIG. 7, an anti-reflective coating 14 is formed on the bottom surface of the transparent substrate 11. In addition, a light guide plate (LGP) 3 is adopted for guiding the short-wavelength light emitted by the lighting element 2 to pass through the transparent substrate 11. From FIG. 4, engineers skilled in development and manufacture of backlight modules should know that, the fourth embodiment of the light conversion material 1 is designed to be applied in a backlight module.

Fifth Embodiment

Figure 8:
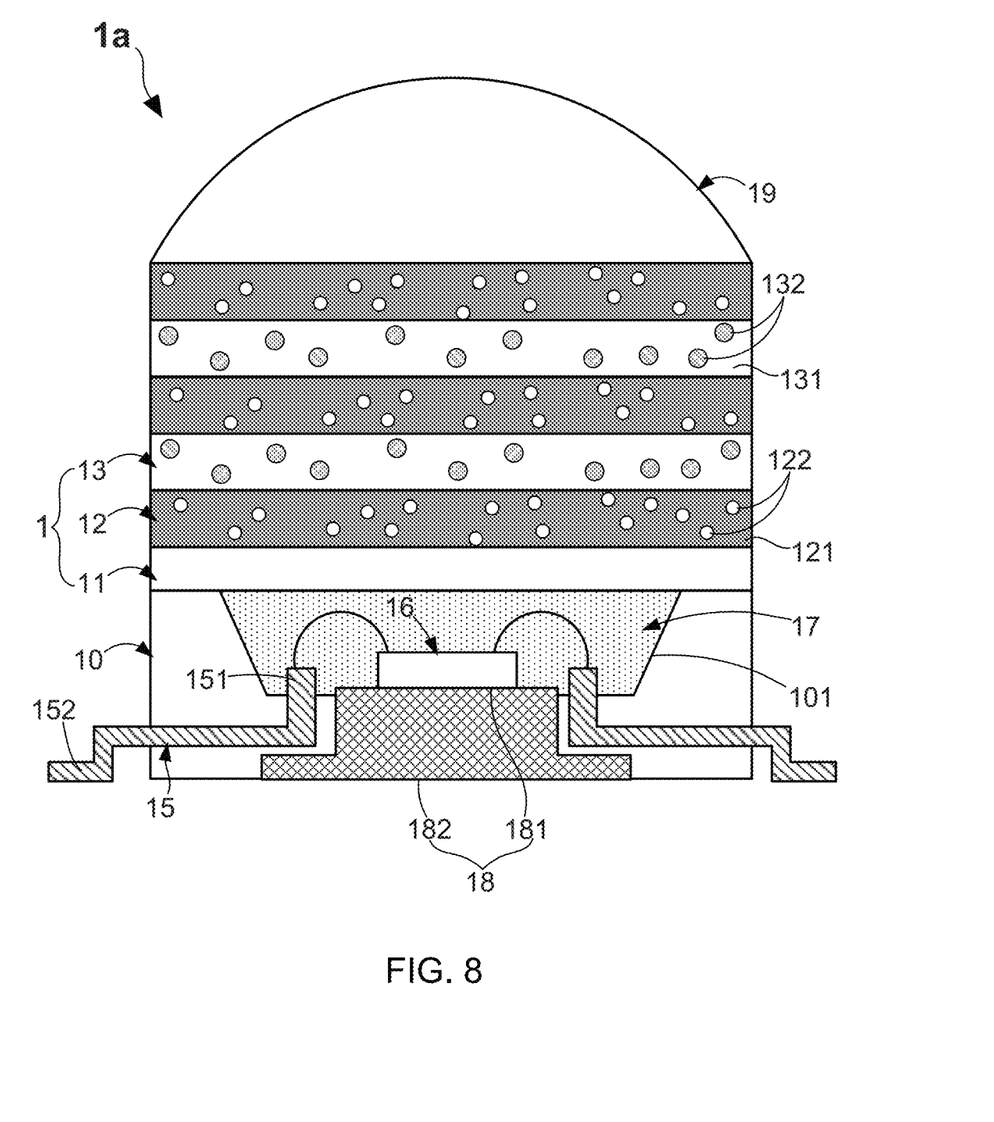
FIG. 8 shows a cross-sectional side view of a light-emitting diode (LED) having the light conversion material with light reflective structure.

With reference to FIG. 8, there is provided a cross-sectional side view of a light-emitting diode (LED) device with the light conversion material with light reflective structure. From FIG. 8, it is understood that, the fifth embodiment of the light conversion material 1 is designed to be applied in an LED device 1a. The LED device 1a comprises: an insulation body 10 having a recess 101, a lead frame 15, an LED die 16 disposed in the recess 101, a colloidal encapsulation 17, and the light conversion material 1 comprising the transparent substrate 11, the at least four first light conversion films 12 and the at least four second light conversion films 13. It is noted that the lead frame 15 is disposed in the insulation body 10 and has at least two welding portions 151 and at least two electrode portions 152, wherein the welding portions 151 are located in the recess 101 and the electrode portions 152 are extending out of the insulation body 10. On the other hand, the LED die 16 is disposed in the recess 101 and connected to the welding portions 152, which is used for emitting a short-wavelength light such as purple light, purple-blue light, or blue light.

Moreover, the colloidal encapsulation 17 is filled into the recess 101 for enclosing the LED die 16 and the welding portions 151, wherein the manufacturing material of the colloidal encapsulation 17 is selected from the group consisting of silicone, silica gel, polymethylmethacrylate (PMMA), polycarbonate (PC), polyvinyl chloride (PVC), polystyrene (PS), polyethylene terephthalate (PET), and epoxy resin. On the other hand, the said light conversion material 1 is disposed on the colloidal encapsulation 17. As FIG. 7 shows, the LED device 1a further comprises a heat sink 18 and a lens 19 disposed on the light conversion material 1. The heat sink 18 is disposed in the insulation body 10 and having an LED contacting portion 181 and a heat dissipating portion 182; wherein the LED contacting portion 181 locates in the recess 101 for contacting the LED die 16, and the heat dissipating portion 182 extends out of the insulation body 10.

Figure 9:
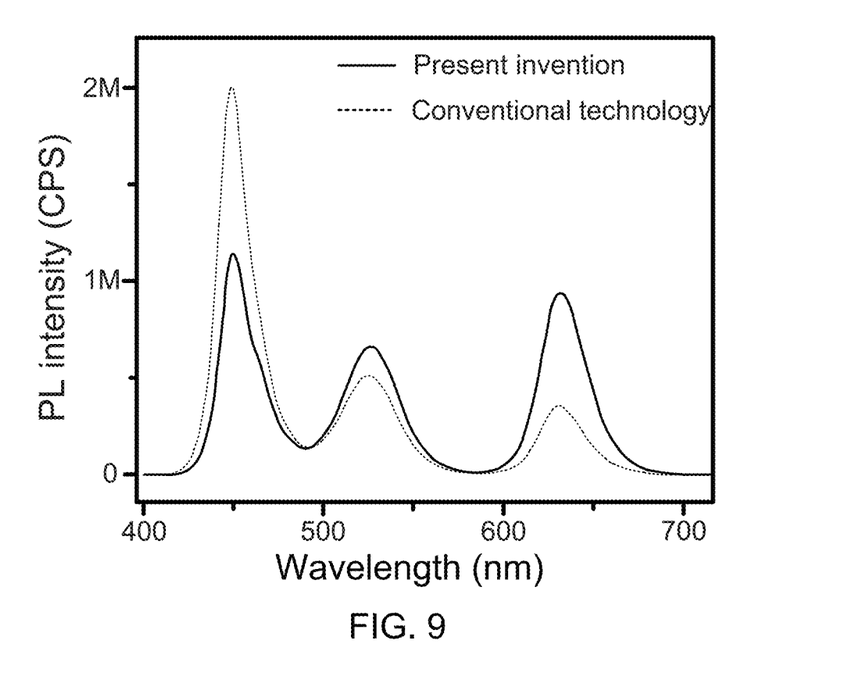
FIG. 9 shows a photoluminescence (PL) spectrum of the light conversion material.
Figure 10:
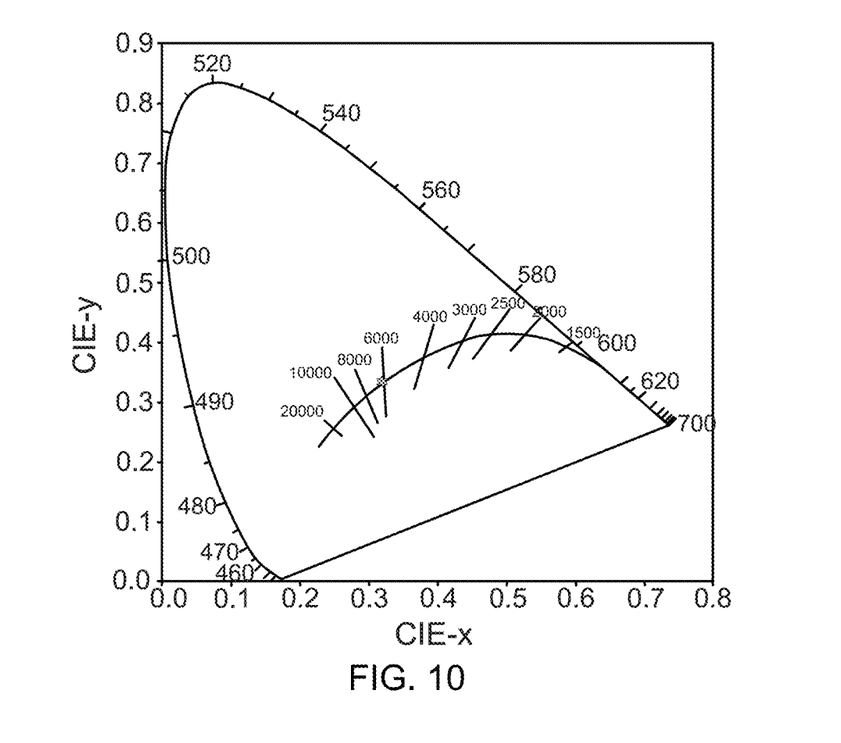
FIG. 10 shows a CIE 1931 chromaticity diagram.

Please refer to FIG. 9 and FIG. 10, wherein FIG. 9 shows a photoluminescence (PL) spectrum of the light conversion layer, and FIG. 10 presents a CIE 1931 chromaticity diagram. From FIG. 9, it is found that the purple-blue light irradiated from the light conversion material 1 with light reflective structure exhibits a PL intensity almost equal to that of other two PL beams (i.e., the red light and the green light), thereby causing the LED device 1a (shown as FIG. 7) performs an excellent illumination uniformity. Moreover, experimental data of FIG. 9 also indicate that the light intensity of a white light emitted by the LED device 1a is greater than that of the conventional QD-LED 1' (shown as FIG. 1) by about 20%. On the other hand, FIG. 10 shows that a white light emitted by the LED device 1a has a CIE coordinate of (0.3185, 0.352) and a color temperature (CT) of 6,000 K.

Sixth Embodiment

Figure 11A:
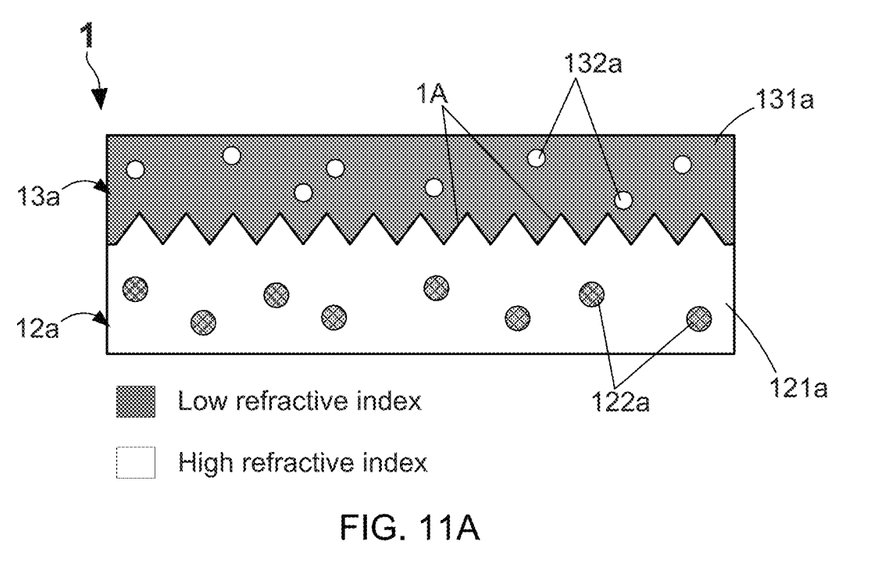
FIG. 11A and FIG. 11B show two cross-sectional side views of a six embodiment of the light conversion material with light reflective structure.
Figure 11B:
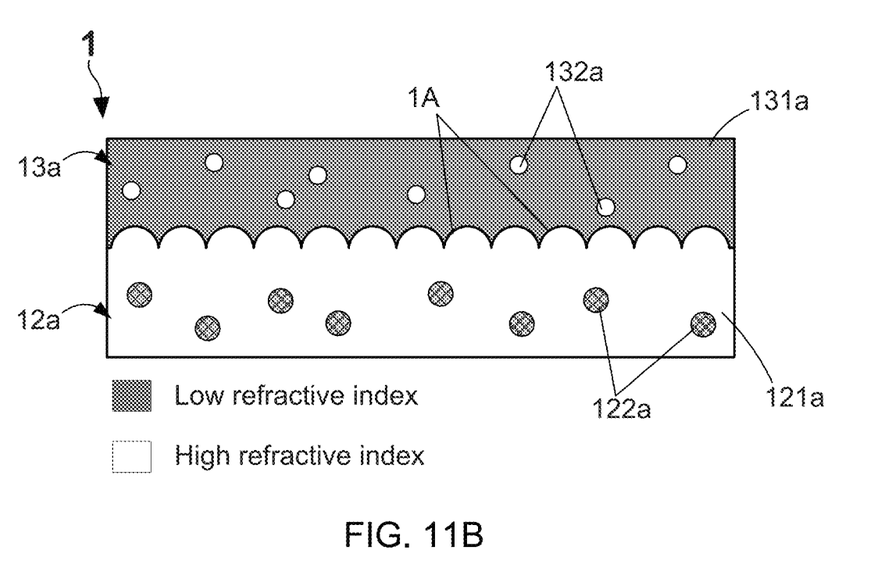

With reference to FIG. 11A and FIG. 11B, there are provided two cross-sectional side views of a sixth embodiment of the light conversion material with light reflective structure. From FIG. 11A and FIG. 11B, it is understood that the sixth embodiment of the light conversion material 1 mainly comprises at least one first light conversion film 12a, at least one second light conversion film 13a formed on the first light conversion film 12a, and an interfacial microstructure 1A formed between the first light conversion film 12a and the second light conversion film 13a. The first light conversion film 12a comprises a first encapsulation layer 121a and a plurality of first light conversion particles 122a dispersed in the first encapsulation layer 121a. In contrast to the first light conversion film 12a, the second light conversion film 13a comprises a second encapsulation layer 131a and a plurality of second light conversion particles 132a dispersed in the second encapsulation layer 131a.

In the sixth embodiment, the first encapsulation layer 121a has a first refractive index and the second encapsulation layer 131a has a second refractive index lower than the first refractive index. For instance, the manufacturing material of the first encapsulation layer 121a can be $HfO_2$, ZnO, $TiO_2$, $TeO_2$, $MoO_3$, $ZrO_2$, $TaO_2$, or $Nb_2O_5$, and the manufacturing material of the second encapsulation layer 131a can be tetraethyl orthosilicate (TEOS), isooctyl acrylate, $SiO_2$, polydimethylsiloxane (PDMS), or $MgF_2$. Moreover, From FIG. 6A and FIG. 6B, it is also found that the interfacial microstructure 1A can be a half-oval microstructure, a triangle microstructure, or a half-circle microstructure.

Seventh Embodiment

Figure 12A:
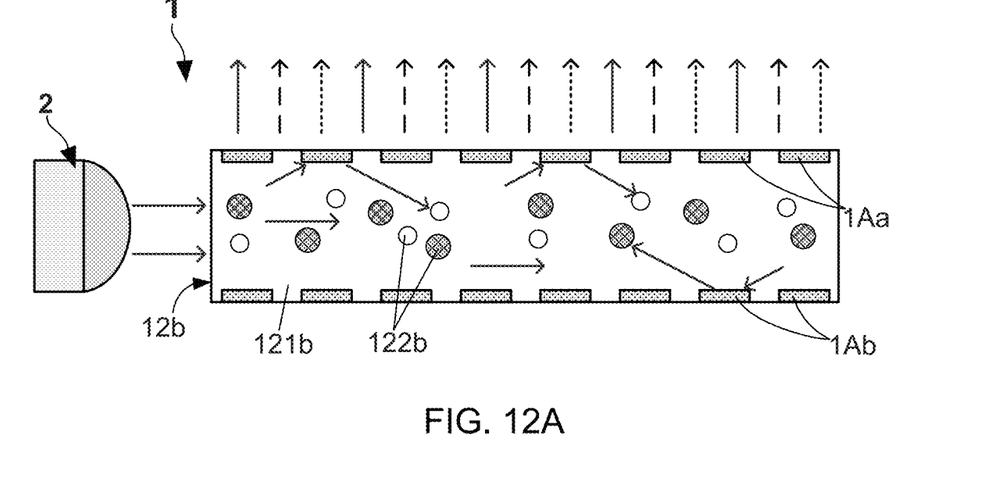
FIG. 12A and FIG. 12B show two cross-sectional side views of a seventh embodiment of the light conversion material with light reflective structure.
Figure 12B:
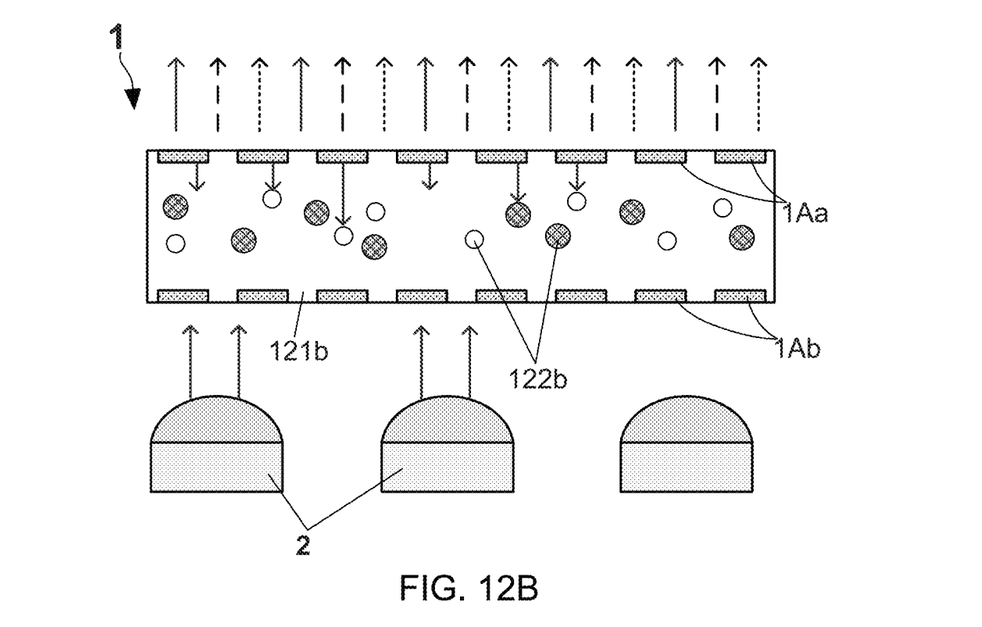

FIG. 12A and FIG. 12B illustrate two cross-sectional side views of a seventh embodiment of the light conversion material with light reflective structure. The seventh embodiment of the light conversion material 1 comprises a light conversion film 12b, a first interfacial microstructure 1Aa and a second interfacial microstructure 1Ab, wherein the light conversion film 12b comprises an encapsulation layer 121b and a plurality of light conversion particles 122b dispersed in the encapsulation layer 121b. On the other hand, the first interfacial microstructure 1Aa is formed at one interface of the encapsulation layer 121b, and the second interfacial microstructure 1Ab is formed at the other one interface of the encapsulation layer 121b. In FIG. 12A, the encapsulation layer 121b is made of a light-guide material, and a short-wavelength light emitted from a lighting element 2 gets into the encapsulation layer 121b by being incident on one side surface of the encapsulation layer 121b.

In FIG. 12B, however, the encapsulation layer 121b is made of a transparent material, such that the short-wavelength light emitted from the lighting element 2 gets into the encapsulation layer 121b by being incident on the top surface or the bottom surface of the encapsulation layer 121b. Herein it needs to further explain that, both the first interfacial microstructure 1Aa and the second interfacial microstructure 1Ab are a dot array formed by $TiO_2$, $ZrO_2$, ZnO, $SeO_2$, $MoO_3$, $Nb_2O_5$, or $Ta_2O_5$.

Eighth Embodiment

Figure 13A:
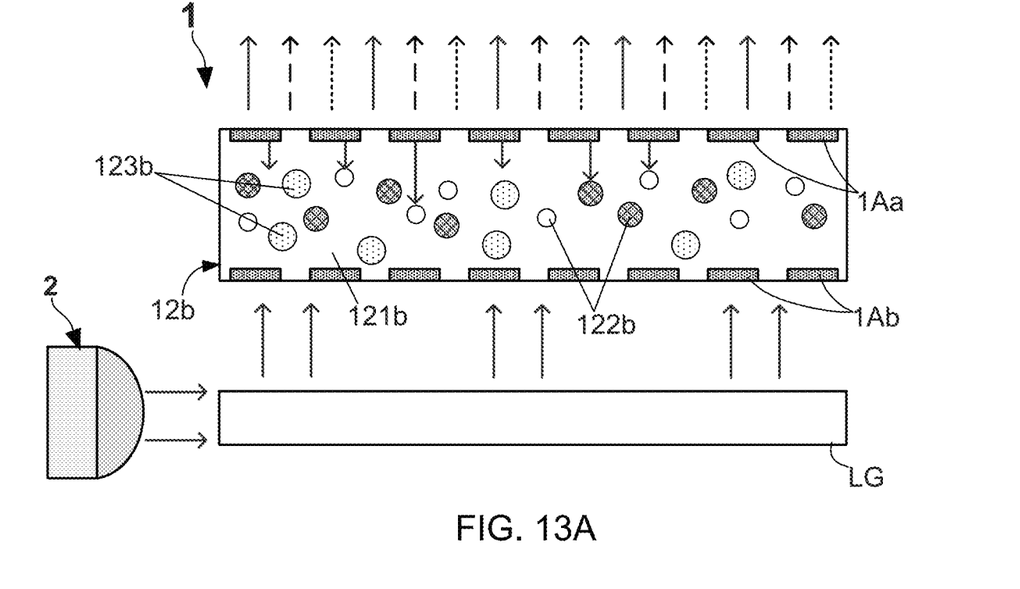
FIG. 13A and FIG. 13B show two cross-sectional side views of an eighth embodiment of the light conversion material with light reflective structure.
Figure 13B:
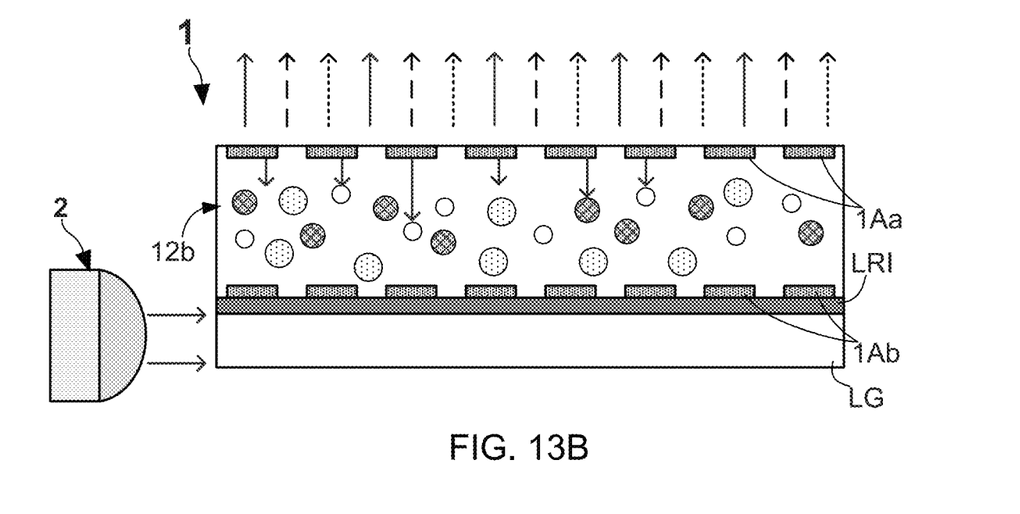

FIG. 13A and FIG. 13B illustrate two cross-sectional side views of a eighth embodiment of the light conversion material with light reflective structure. The seventh embodiment of the light conversion material 1 comprises a light conversion film 12b, a first interfacial microstructure 1Aa, and a second interfacial microstructure 1Ab, and a light guide plate LG, wherein the first interfacial microstructure 1Aa is formed at one interface of the encapsulation layer 121b, and the second interfacial microstructure 1Ab is formed at the other one interface of the encapsulation layer 121b. In FIG. 13A, the encapsulation layer 121b is made of a transparent material, such that the short-wavelength light emitted from the lighting element 2 gets into the encapsulation layer 121b after by being incident on the light guide plate LG.

Moreover, in FIG. 13B, the guide plate LG is connected to the bottom surface of the encapsulation layer 121b through a medium layer LRI with low refractive index.

Therefore, through above descriptions, all embodiments and their constituting elements of the light conversion material with light reflective structure proposed by the present invention have been introduced completely and clearly; in summary, the present invention includes the advantages of:

(1) The present invention discloses a light conversion material 1 with light reflective structure, which can be applied in an LED device 1a and comprises: a transparent substrate 11, a plurality of first light conversion films 12 and a plurality of second light conversion films 13. Particularly, the second light conversion film 13 is disposed between two of the first light conversion films 12, and the refractive index of the second light conversion film 13 is greater than that of the first light conversion film 12. By such design, when a short-wavelength light passes through the transparent substrate 11 and is subsequently incident on the first light conversion films 12 and the second light conversion films 13, parts of the short-wavelength light not to be converted to red light and/or green light have a reflected light forming at the junction the first light conversion film 12 and the second light conversion film 13, and the reflected light would ne bounced back into the first light conversion films 12 and/or the second light conversion films 13. By such way, those unconverted short-wavelength light are effectively prevented from directly passing the light conversion material 1. Briefly speaking, this light conversion material 1 exhibits an outstanding performance on short-wavelength light recycling, and can be used in the LED device 1a for enhancing illumination uniformity and Color rendering.

The above description is made on embodiments of the present invention. However, the embodiments are not intended to limit scope of the present invention, and all equivalent implementations or alterations within the spirit of the present invention still fall within the scope of the present invention.

What is claimed is:

1. A light conversion material with light reflective structure, comprising:
   a transparent substrate;
   at least five first light conversion films, being formed on the top surface of the transparent substrate, wherein each of the at least five first light conversion films comprises a first encapsulation layer and a plurality of first light conversion particles dispersed in the first encapsulation layer; and
   at least four second light conversion films, wherein each one of the at least four second light conversion films is disposed between two of the at least five first light conversion films, and each of the at least four second light conversion films comprising a second encapsulation layer and a plurality of second light conversion particles dispersed in the second encapsulation layer;
   wherein the first encapsulation layer has a first refractive index and the second encapsulation layer has a second refractive index greater than the first refractive index;
   wherein when a short-wavelength light passes through the transparent substrate via the bottom surface of the transparent substrate and is subsequently incident on the first light conversion films and the second light conversion films, parts of the short-wavelength light being converted to a red light and/or a green light by the first light conversion films and the second light conversion films;
   wherein parts of the short-wavelength light not to be converted to the green light and/or the red light would have a reflected light forming at the junction between the first light conversion film and the second light conversion film, and the reflected light would bounce back into the first light conversion film and/or the second light conversion film;
   wherein the other parts of the short-wavelength light directly pass through the at least five first light conversion films and the at least four second light conversion films.

2. The light conversion material of claim 1, wherein the first encapsulation layer is made of a transparent material that is selected from the group consisting of tetraethyl orthosilicate (TEOS), isooctyl acrylate, $SiO_2$, polydimethylsiloxane (PDMS), $MgF_2$, and combination of any aforesaid two or more materials.

3. The light conversion material of claim 1, wherein the second encapsulation layer is made of a transparent material that is selected from the group consisting of $HfO_2$, ZnO, $TiO_2$, $TeO_2$, $MoO_3$, $ZrO_2$, $TaO_2$, $Nb_2O_5$, and combination of any aforesaid two or more materials.

4. The light conversion material of claim 1, wherein one of the first light conversion particles and the second light conversion particles converts the short-wavelength light to the green light, and the other one converting the short-wavelength light to the red light.

5. The light conversion material of claim 1, wherein the first light conversion particles and the second light conversion particles convert the short-wavelength light to the green light or the red light.

6. The light conversion material of claim 1, wherein both the first light conversion particles and the second light conversion particles are selected from the group consisting of phosphor powder and quantum dots.

7. The light conversion material of claim 1, wherein both the first light conversion film and the second light conversion film have a thickness equal to one-quarter wavelength of the short-wavelength light.

8. The light conversion material of claim 1, wherein the first refractive index is gradiently increased from the junction of the first encapsulation layer and the second encapsulation layer to the center of the first encapsulation layer.

9. The light conversion material of claim 1, wherein the second refractive index is gradiently decreased from the junction of the second encapsulation layer and the first encapsulation layer to the center of the second encapsulation layer.

10. The light conversion material of claim 1, further comprising:
   an anti-reflective layer, being formed on the bottom surface of the transparent substrate;
   wherein the short-wavelength light is capable of being incident on the first conversion films and the second conversion films through a light guide plate and the bottom surface of the transparent substrate.

* * * * *